United States Patent
Tokuhashi

(10) Patent No.: US 9,013,244 B2
(45) Date of Patent: Apr. 21, 2015

(54) OSCILLATING DEVICE, OSCILLATING ELEMENT AND ELECTRONIC APPARATUS

(71) Applicant: Seiko Epson Corporation, Tokyo (JP)

(72) Inventor: Motohiro Tokuhashi, Atsugi (JP)

(73) Assignee: Seiko Epson Corporation (JP)

(*) Notice: Subject to any disclaimer, the term of this patent is extended or adjusted under 35 U.S.C. 154(b) by 25 days.

(21) Appl. No.: 13/897,482

(22) Filed: May 20, 2013

(65) Prior Publication Data

US 2013/0314169 A1    Nov. 28, 2013

(30) Foreign Application Priority Data

May 23, 2012 (JP) ................................ 2012-117165

(51) Int. Cl.
*H03L 1/02* (2006.01)
*H03L 1/04* (2006.01)

(52) U.S. Cl.
CPC ............... *H03L 1/022* (2013.01); *H03L 1/023* (2013.01); *H03L 1/04* (2013.01)

(58) Field of Classification Search
USPC ................................................ 331/176, 158
See application file for complete search history.

(56) References Cited

U.S. PATENT DOCUMENTS

| 2001/0048349 A1* | 12/2001 | Matsumoto et al. ............ 331/25 |
| 2006/0012446 A1 | 1/2006 | Hardy et al. |
| 2007/0268079 A1 | 11/2007 | Hardy et al. |

FOREIGN PATENT DOCUMENTS

| JP | 1-248806 | 10/1989 |
| JP | 2008-507174 A | 3/2008 |
| JP | 2010-124348 A | 6/2010 |

* cited by examiner

*Primary Examiner* — Joseph Chang
(74) *Attorney, Agent, or Firm* — Harness, Dickey & Pierce, P.L.C.

(57) ABSTRACT

An oscillating device includes a temperature compensated oscillator that compensates a frequency temperature characteristic in a temperature compensation range including apart of a first temperature range, and a temperature control circuit that includes a heater and controls a temperature of a quartz crystal resonator of the temperature compensated oscillator into a second temperature range included in the temperature compensation range. Further, the temperature compensation range of the temperature compensated oscillator may include a part of the first temperature range in which compensation can be performed by first-order approximation.

8 Claims, 9 Drawing Sheets

OSCILLATING DEVICE, OSCILLATING ELEMENT AND ELECTRONIC APPARATUS

BACKGROUND

1. Technical Field

The present invention relates to an oscillating device, an oscillating element and an electronic apparatus.

2. Related Art

In a TCXO (Temperature Compensated X'tal Oscillator), high frequency stability is obtained by cancelling a shift (frequency deviation) of the oscillation frequency of a quartz crystal resonator from a desired frequency (nominal frequency) in a specified temperature range. For example, the frequency stability of the general TCXO is about ±200 ppb (use temperature range: −20° C. to +70° C.).

As shown in FIG. 12A, an AT-cut quartz crystal resonator in which the frequency temperature characteristic is approximated by a cubic function is generally used in the TCXO. However, the cubic functions of the respective AT-cut quartz crystal resonators are different from each other. Thus, in characteristic inspection of the TCXO, a relation between temperatures at four or more points and oscillation frequencies is obtained, and information (temperature compensation information) for temperature compensation of the frequency temperature characteristic of the quartz crystal resonator is required to be calculated.

When the TCXO operates, a temperature compensation voltage to generate a frequency change as shown in FIG. 12B is internally generated based on the temperature compensation information, and the frequency temperature characteristic of an oscillation signal to be outputted is made to approach a flat characteristic.

In recent years, in a small base station for a small call area such as a femto cell or a measurement device, a more highly accurate clock signal is required. In such use, a frequency stability of, for example, about ±50 ppb is often required.

As an oscillating device with excellent frequency stability as compared with the TCXO, there is an OCXO (Oven Controlled Crystal Oscillator) provided with a constant temperature oven. However, since the constant temperature oven and a temperature control circuit thereof are provided, there is a defect that the OCXO is expensive and is large as compared with the TCXO.

According to the invention disclosed in JP-A-2010-124348 (patent literature 1), a base mounted with a TCXO is sealed with a cover and the temperature is kept constant. This has a middle temperature characteristic between the TCXO and the OCXO, and an inexpensive and small oscillating device is provided.

However, also in the method of patent literature 1, a temperature compensation voltage as shown in FIG. 12B is internally generated with respect to temperature change, and the frequency temperature characteristic of an oscillation signal to be outputted is made flat. Thus, at the time of manufacture, such an operation is required that high-order functions different among the respective AT-cut quartz crystal resonators are obtained, and for example, an adjustment is made so that a local maximum value and a local minimum value are offset by each other. At this time, it is necessary to obtain a relation between temperatures at four or more points and oscillation frequencies, and the efficiency of manufacture is reduced.

Besides, in the method of patent literature 1, a closed space formed by sealing the base with the cover functions as a pseudo oven (hereinafter, the term "oven" includes the pseudo oven of the closed space as stated above). At this time, it is necessary to keep the oven at a specified temperature with high accuracy (for example, ±1° C.) comparable to the OCXO. However, in the oscillating device of patent literature 1 which is constructed by assembling the TCXO and other circuits, a variation between individuals is liable to occur. Thus, the adjustment operation of the temperature control circuit is required in order to adjust the temperature of the oven to a target temperature. However, in order to keep the temperature of the oven in a narrow range of, for example, ±1° C., the adjustment operation becomes very troublesome.

As described above, in the method of patent literature 1, the adjustment operation before shipment takes time, the efficiency of manufacture is reduced, and consequently, there is a high possibility that the cost rises.

SUMMARY

An advantage of some aspects of the invention is to provide a small and inexpensive oscillating device without reducing the efficiency of manufacture while frequency stability is improved.

The invention can be implemented as the following forms or application examples.

Application Example 1

An oscillating device according to this application example includes a temperature compensated oscillator that includes an oscillating element and compensates a frequency temperature characteristic in a temperature compensation range including a part of a first temperature range, and a temperature control circuit that controls a temperature of the oscillating element into a second temperature range included in the temperature compensation range.

Application Example 2

In the oscillating device of the application example, the temperature compensation range of the temperature compensated oscillator may include a part of the first temperature range in which compensation can be performed by first-order approximation.

Application Example 3

In the oscillating device of the application example, the temperature compensation range of the temperature compensated oscillator may be a part at a high temperature side including an upper limit temperature of the first temperature range.

The oscillating device according to these application examples includes the temperature compensated oscillator and the temperature control circuit. The temperature compensated oscillator compensates the frequency temperature characteristic according to the temperature of the oscillating element. The temperature compensated oscillator is, for example, a TCXO (Temperature Compensated X'tal Oscillator), a silicon oscillator or the like.

The temperature compensated oscillator performs the temperature compensation in the part of a use temperature range, that is, the first temperature range in which an expected characteristic can be obtained by the temperature compensated oscillator at the time of use. That is, compensation is not required to be performed by obtaining a high-order function in all the use temperature range. Thus, at the time of manufacture, the labor of, for example, an operation to perform adjustment so that a local maximum value and a local minimum value are offset by each other is reduced.

For example, part of the use temperature range in which compensation can be performed by first-order approximation may be the temperature compensation range. At this time, it is sufficient if a relation between temperatures at two points and oscillation frequencies is obtained, and the adjustment becomes easy. Thus, the manufacture efficiency can be raised. Besides, since the compensation is performed by the first-order approximation, the frequency stability in the temperature compensation range can be improved. The part of the use temperature range in which the compensation can be performed by the first-order approximation includes, for example, a range near an upper limit temperature or a lower limit temperature (see FIG. 12A).

The temperature control circuit uses a temperature adjustment element to control the temperature of the oscillating element of the temperature compensated oscillator into the second temperature range included in the temperature compensation range. That is, the temperature of an oven containing the oscillating element is kept in the second temperature range. The temperature adjustment element may be, for example, a heat generating element (hereinafter referred to as a heater) to generate heat, or a Peltier element.

The temperature of the oscillating element falls in the temperature compensation range of the temperature compensated oscillator by the control of the temperature control circuit. Thus, the oscillating device in which the frequency stability is improved can be provided. At this time, since a constant temperature oven is not used unlike the OCXO, the oscillating device is small and inexpensive.

Besides, in the temperature compensated oscillator, the temperature compensation range may be the part of the use temperature range at the high temperature side including the upper limit temperature. At this time, not only the compensation can be performed by the first-order approximation, but also the heater can be used as the temperature adjustment element. Thus, the cost can be reduced. For example, the heater can be realized by one power transistor.

Application Example 4

In the oscillating device of the application example, the temperature control circuit may include a temperature sensor to measure the temperature of the oscillating element, and determine the second temperature range in which a magnitude of a difference between a lower limit temperature of the second temperature range and a lower limit temperature of the temperature compensation range and a magnitude of a difference between an upper limit temperature of the temperature compensation range and an upper limit temperature of the second temperature range are larger than a magnitude of a difference between a measured value of the temperature sensor and an actual temperature of the oscillating element.

Application Example 5

In the oscillating device of the application example, the temperature control circuit may include a heat generating element to heat the oscillating element.

The oscillating device includes the temperature sensor to measure the temperature of the oscillating element. Since the temperature sensor is not provided inside the temperature compensated oscillator, the measured temperature includes an error. However, according to the oscillating device, the second temperature range is set so as to have a larger margin than the error, and even if the error occurs, the temperature of the oven is made to fall in the temperature compensation range without fail. Thus, the oscillating device in which the frequency stability is improved can be provided. Besides, when the heater is used as the heat generating element in order to adjust the temperature of the oven, the cost can be reduced.

Application Example 6

In the oscillating device of the application example, the oscillating element may be an oscillator.

Application Example 7

An electronic apparatus according to this application example includes the oscillating device according to the application example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described in detail with reference to the drawings. Incidentally, the embodiments described below do not unduly limit the content of the invention recited in the appended claims. Besides, all of components described below are not necessarily indispensable components of the invention.

1. Whole Structure of Oscillating Device

Figure 1:
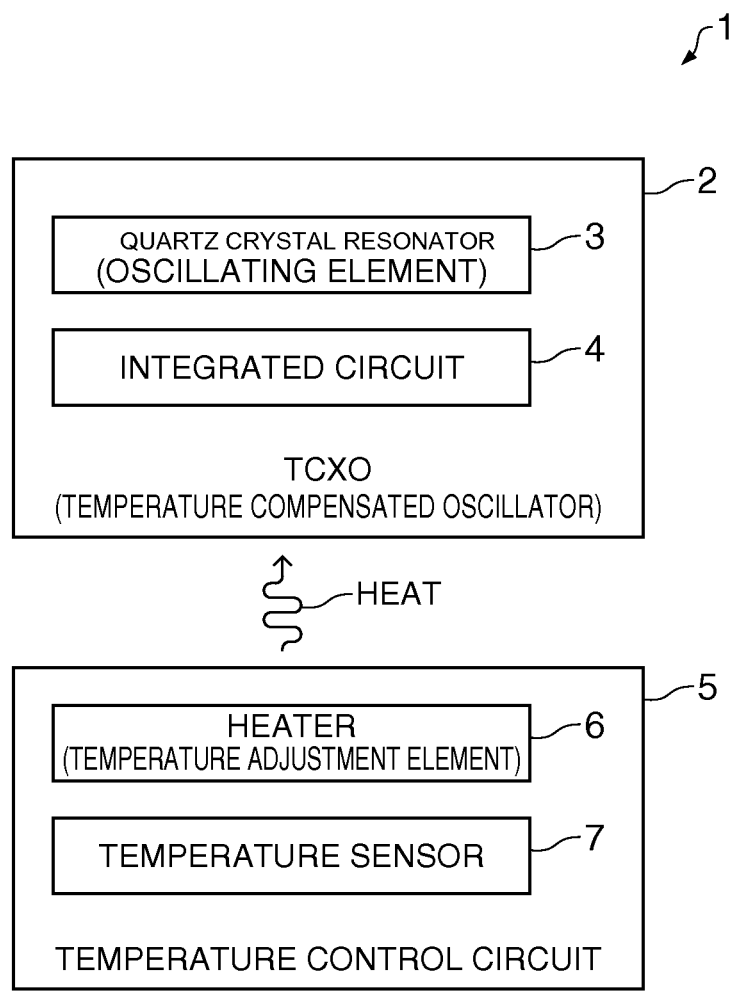
FIG. 1 is a view showing a structural example of an oscillating device of an embodiment.

FIG. 1 is a view showing a structure of an oscillating device 1 of an embodiment. The oscillating device 1 includes a TCXO 2 and a temperature control circuit 5. The TCXO 2 includes a quartz crystal resonator 3 and an integrated circuit 4. The temperature control circuit 5 includes a heater 6 and a temperature sensor 7.

Here, the TCXO 2, the quartz crystal resonator 3 and the heater 6 of FIG. 1 correspond to a temperature compensated oscillator, an oscillating element and a temperature adjustment element of the embodiment of the invention.

The TCXO 2 compensates a frequency temperature characteristic in a temperature compensation range including a part of a use temperature range. For example, in this embodiment, the use temperature range is −20° C. to +85° C. the TCXO 2 compensates the frequency temperature characteristic in the temperature compensation range (+70° C. to 100° C.) including only a part (for example, +70° C. to +85° C.) of the use temperature range.

The integrated circuit 4 (IC) includes not only a temperature compensating circuit as described later, but also an oscillation circuit connected to the quartz crystal resonator 3, and is formed into one chip.

The temperature control circuit 5 adjusts the temperature of the TCXO 2 by heat of the heater 6. Specifically, control is performed so as to keep the temperature of an oven 18 (see FIG. 7A) described later. At this time, the temperature of the oven 18 falls in a certain range included in the temperature compensation range.

The temperature sensor 7 is arranged near the quartz crystal resonator 3 and measures temperature. The temperature control circuit 5 controls heat generation of the heater 6 based on the measured temperature of the temperature sensor 7. In this embodiment, the heater 6 is a power transistor 30 (see FIG. 5) as a heat generating element. Besides, the temperature sensor 7 is an NTC thermistor 11 (see FIG. 5).

2. Structure of the TCXO

Figure 2:
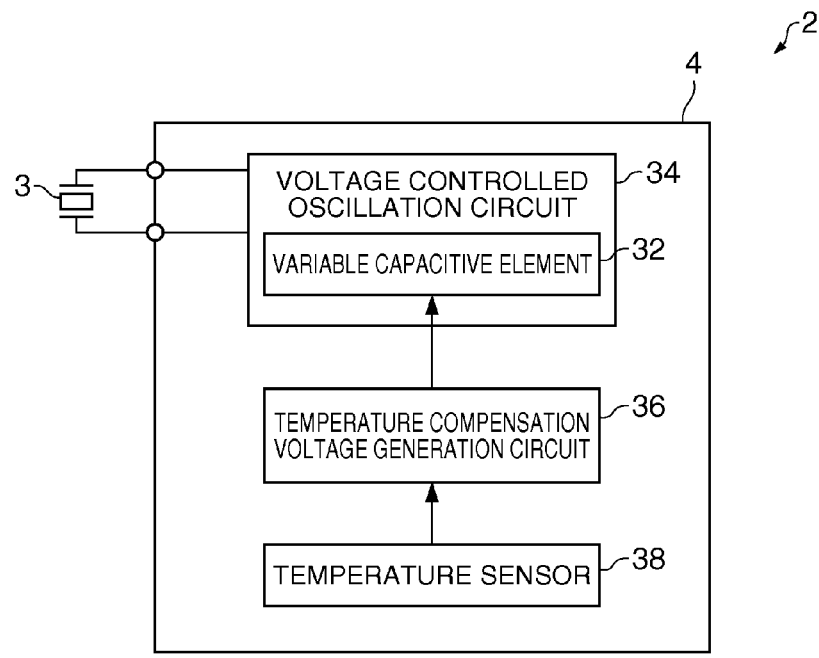
FIG. 2 is a view showing a structural example of a TCXO of the embodiment.

FIG. 2 is a view showing a structure of the TCXO 2 of the embodiment. As shown in FIG. 2, in this embodiment, the integrated circuit 4 includes a voltage controlled oscillation circuit 34, a temperature compensation voltage generation circuit 36 and a temperature sensor 38.

The voltage controlled oscillation circuit 34 is connected to the quartz crystal resonator 3 through a terminal, and controls the oscillation frequency of the quartz crystal resonator 3 by changing the capacitance value of a variable capacitive element 32 according to a control voltage from the temperature compensation voltage generation circuit 36. An oscillation signal of the voltage controlled oscillation circuit 34 is outputted to the outside through a terminal (not shown).

The temperature compensation voltage generation circuit 36 generates the control voltage based on an output value (for example, voltage value) from the temperature sensor 38. Here, the temperature sensor 38, together with the quartz crystal resonator 3, exists in the TCXO 2 differently from the temperature sensor 7 of FIG. 1. Thus, as compared with the temperature sensor 7, the temperature of the quartz crystal resonator 3 can be accurately measured.

Figure 3:
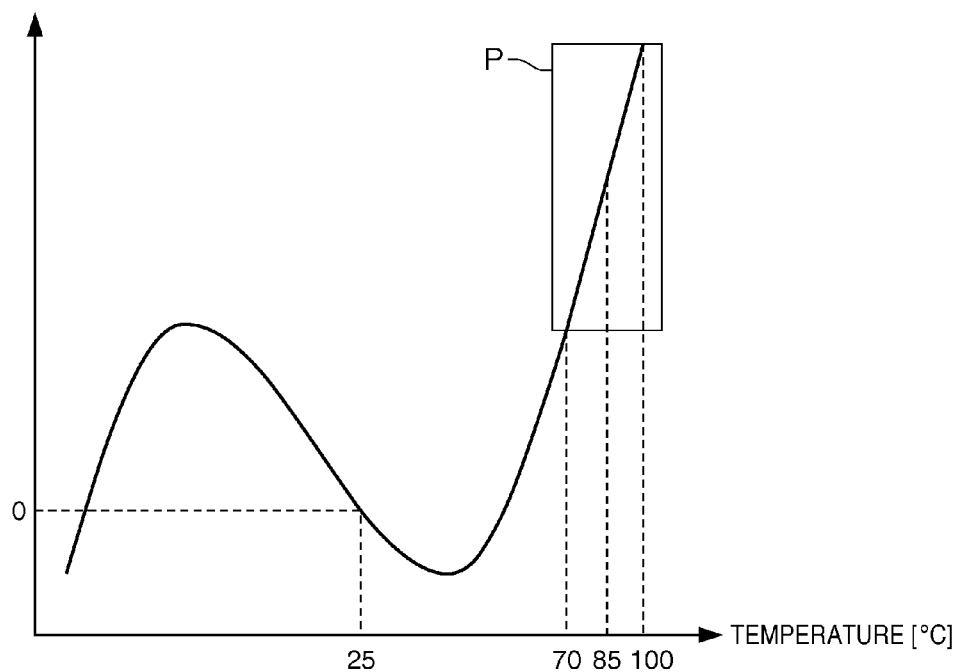
FIG. 3 is a view showing an example of frequency stability of a quartz crystal resonator of the embodiment.
Figure 12A:
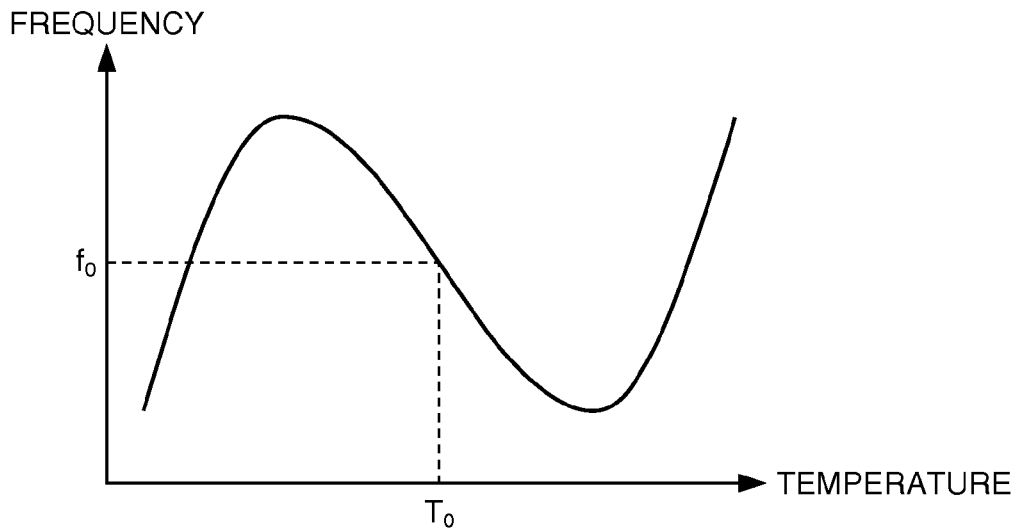
FIG. 12A is a view showing an example of a frequency temperature characteristic of a quartz crystal resonator.
Figure 12B:
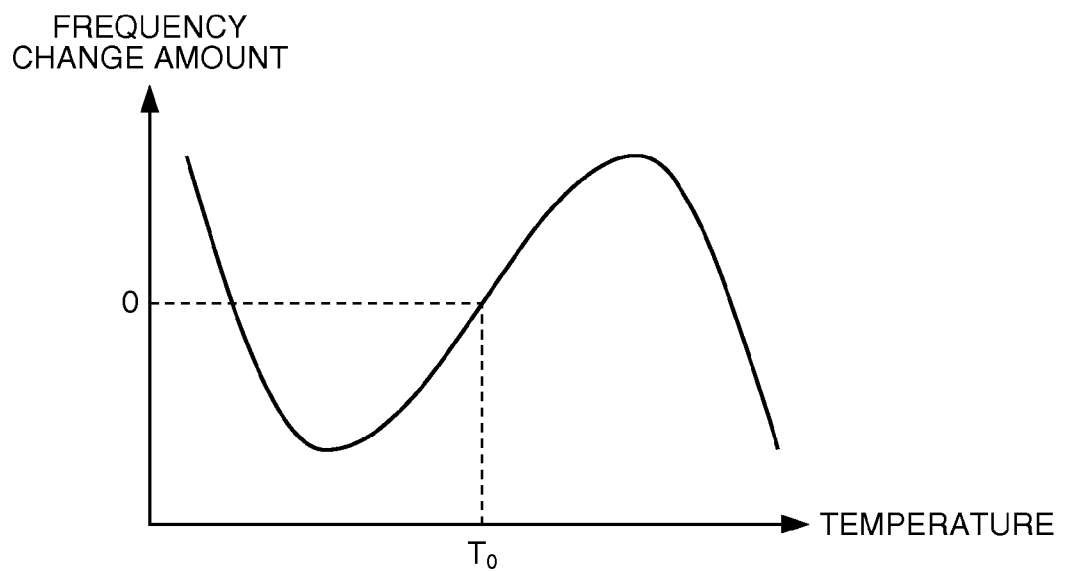
FIG. 12B is a view showing an example of a frequency change by a temperature compensation voltage.

Here, if temperature compensation is not considered, the frequency stability of the quartz crystal resonator 3 becomes as shown in FIG. 3. The frequency stability in FIG. 3 represents a variation with respect to a frequency at 25° C. As shown in FIG. 3, when temperature is near 85° C. as the upper limit temperature of the use temperature range, the change of the frequency stability can be linearly approximated. That is, approximation can be performed by a linear function, not a high-order function (see FIG. 12B). Accordingly, if the temperature compensation is performed only in the range (P in FIG. 3) of ±15° C. (that is, 70° C. to 100° C.) with respect to 85° C. as the upper limit temperature of the use temperature range, highly accurate compensation can be performed by the linear approximation.

Figure 4:
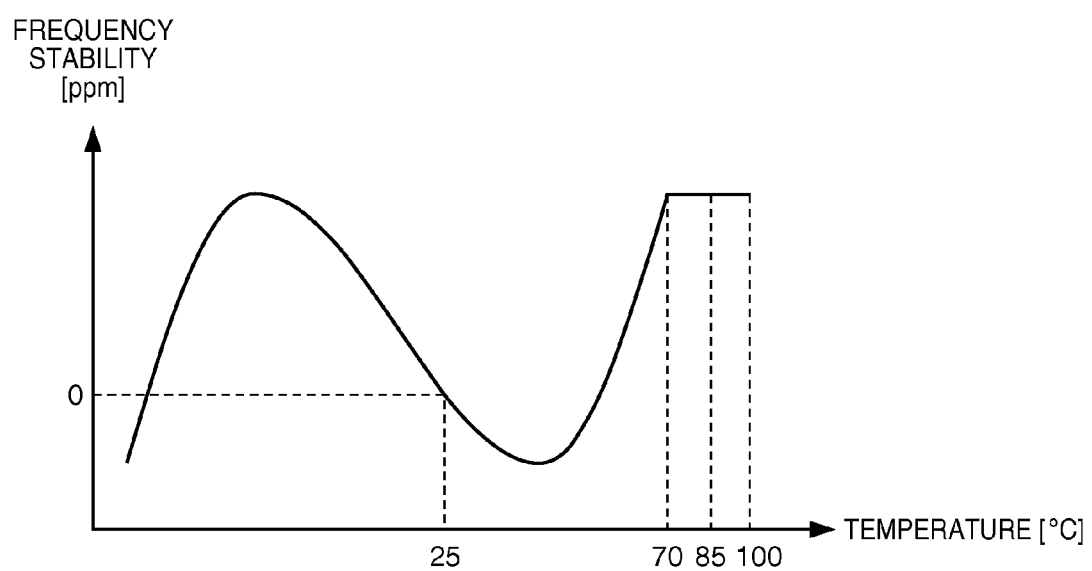
FIG. 4 is a view showing an example of temperature compensation of the TCXO of the embodiment.

FIG. 4 shows frequency stability of the output after the temperature compensation of the TCXO 2 of the embodiment. As shown in FIG. 4, the frequency stability is flat in the range of 85° C.±15° C., and the excellent frequency stability is shown. That is, as long as the TCXO 2 of the embodiment is used in the range of 85° C.±15° C., the frequency stability comparable to that of the OCXO can be obtained.

Thus, in the oscillating device 1 of the embodiment, the temperature control circuit 5 performs the temperature control so that the temperature of the oven 18 (see FIG. 7A) including the quartz crystal resonator 3 falls in the range of 85° C.±15° C. Hereafter, the temperature control circuit 5 will be described in detail.

3. Temperature Control Circuit

Figure 5:
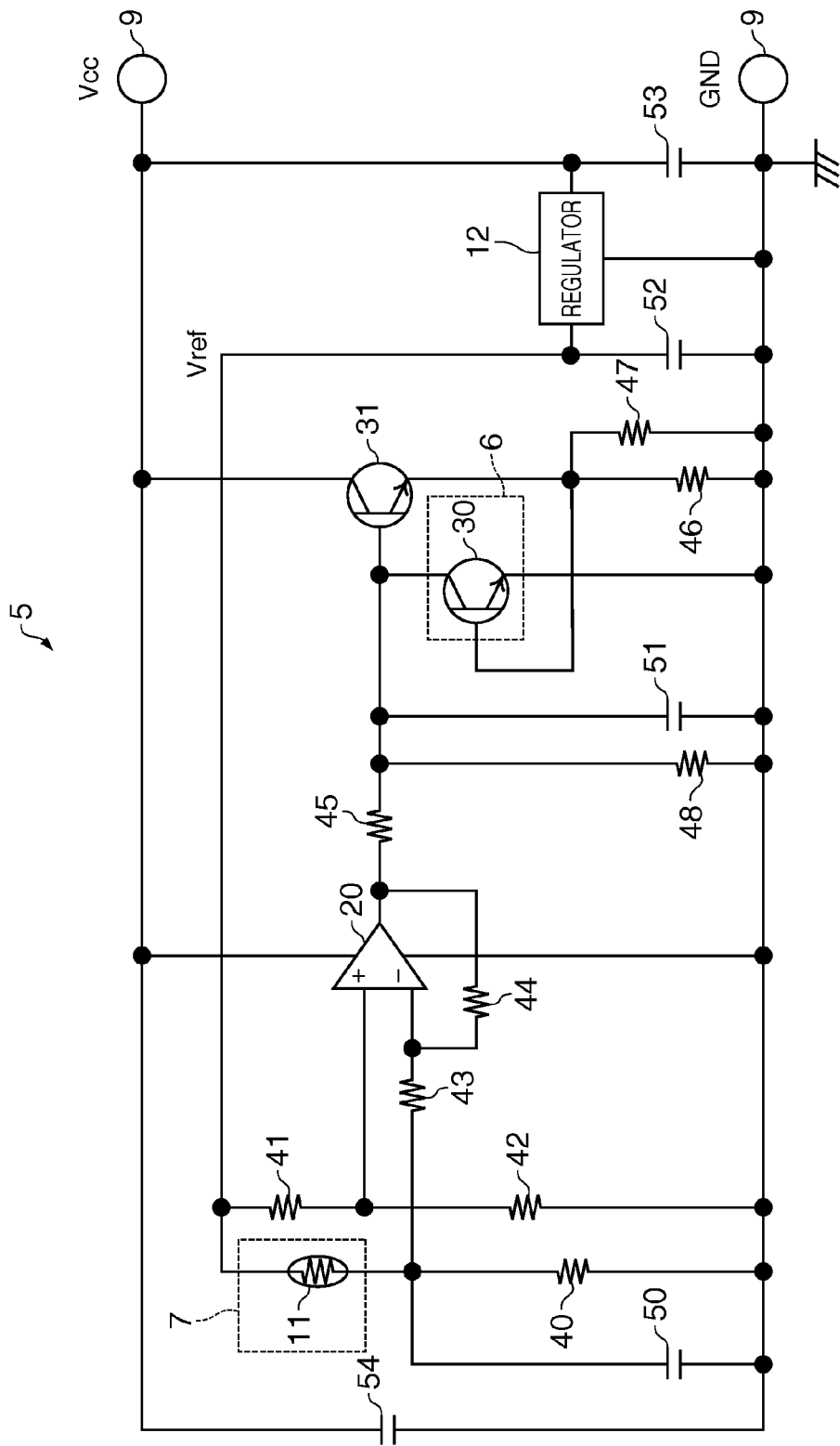
FIG. 5 is a circuit view showing an example of a temperature control circuit of the embodiment.

FIG. 5 is a circuit view of the temperature control circuit 5 of the embodiment. In the temperature control circuit 5 of FIG. 5, the power transistor 30 corresponds to the heater 6, and the NTC thermistor 11 corresponds to the temperature sensor 7.

A power supply potential Vcc is supplied to an upper terminal 9 of FIG. 5 from the outside. Besides, a lower terminal 9 of FIG. 5 is grounded, and a ground potential GND is supplied. Besides, a regulator 12 generates a reference potential Vref.

A capacitor 52 for removing AC noise is connected between the reference potential Vref and the ground potential GND, and capacitors 53 and 54 for removing AC noise are connected between the power supply potential Vcc and the ground potential GND. Besides, the power supply potential Vcc and the ground potential GND are supplied to a differential amplifier 20 from the terminal 9.

A first terminal of the NTC thermistor 11 is connected to the reference potential Vref, and a second terminal thereof is connected to a first terminal of a resistor 40, a first terminal of a resistor 43 and a first terminal of a capacitor 50. A second terminal of the resistor 40 is connected to the ground potential GND. A second terminal of the resistor 43 is connected to an inverting input terminal (− input terminal) of the differential amplifier 20, and a first terminal of a resistor 44. A second terminal of the resistor 44 is connected to an output terminal of the differential amplifier 20 and a first terminal of a resistor 45. A second terminal of the capacitor 50 is connected to the ground potential GND.

A first terminal of a resistor 41 is connected to the reference potential Vref, and a second terminal thereof is connected to a non-inverting input terminal (+ input terminal) of the differential amplifier 20 and a first terminal of a resistor 42. A second terminal of the resistor 42 is connected to the ground potential GND.

A second terminal of the resistor 45 is connected to a collector terminal of the power transistor 30, a base terminal of a power transistor 31, a first terminal of a capacitor 51 and a first terminal of a resistor 48. A second terminal of the capacitor 51 and a second terminal of the resistor 48 are connected to the ground potential GND.

A collector terminal of the power transistor 31 is connected to the power supply potential Vcc. An emitter terminal thereof is connected to a base terminal of the power transistor 30, a first terminal of a resistor 46 and a first terminal of a resistor 47. An emitter terminal of the power transistor 30, a second terminal of the resistor 46 and a second terminal of the resistor 47 are connected to the ground potential GND.

The power transistor 30 (an example of the heat generating element) is arranged in the vicinity of an object to be heated, and is an NPN bipolar transistor to heat the object to be heated by using heat radiation. Thus, in this embodiment, the power transistor functions as the heater 6. The amount of heat generation changes according to the amount of current flowing through the power transistor 30.

The resistance value of the NTC thermistor 11 changes according to the temperature of the object to be heated as a measurement object. Specifically, the resistance decreases as the temperature of the object to be heated rises. Thus, in this embodiment, the NTC thermistor functions as the temperature sensor 7.

In the temperature control circuit 5 of the embodiment, the differential amplifier 20 can control the amount of heat generation of the power transistor 30 based on the resistance value of the NTC thermistor 11.

If the temperature of the object to be heated is lower than a set temperature, the object to be heated is heated while the amount of heat generation of the power transistor 30 is controlled according to the resistance value of the NTC thermistor 11. Specifically, when the temperature of the object to be heated coincides with the set temperature, the resistance value of the NTC thermistor 11 becomes a specified value, and the potential of the first terminal of the resistor 43 coincides with the potential of the non-inverting input terminal (+ input terminal) of the differential amplifier 20. Accordingly, if the temperature of the object to be heated is lower than the set temperature, since the resistance value of the NTC thermistor 11 is higher than the specified value, the potential of the first terminal of the resistor 43 is lower than the potential of the non-inverting input terminal (+ input terminal) of the differential amplifier 20. Thus, the output potential of the differential amplifier 20 becomes high, and the power transistor 30 is turned on and generates heat.

When the object to be heated is heated by the power transistor 30, and the temperature of the object to be heated rises, the resistance value of the NTC thermistor 11 is reduced. Thus, the potential of the first terminal of the resistor 43 rises. On the other hand, the potential of the non-inverting input terminal (+ input terminal) of the differential amplifier 20 hardly changes. Accordingly, the potential difference between the non-inverting input terminal (+ input terminal) of the differential amplifier 20 and the first terminal of the resistor 43 becomes small. Since the output potential of the differential amplifier 20 is reduced by this, the amount of heat generation of the power transistor 30 is reduced. When the temperature of the object to be heated becomes higher than the set temperature, the power transistor 30 is turned off, and the heating of the object to be heated is stopped.

4. Outer Appearance of the Oscillating Device

Figure 6:
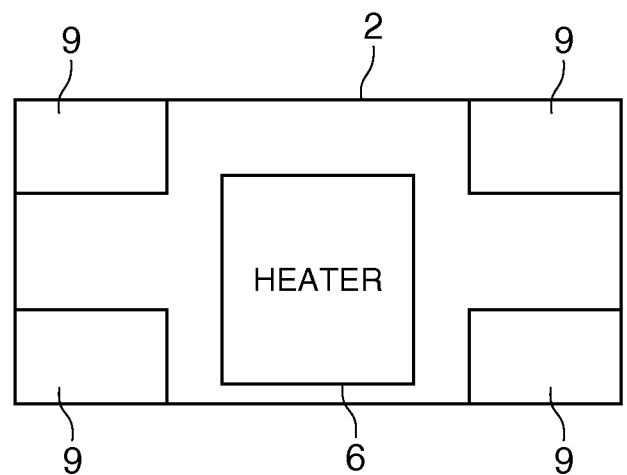
FIG. 6 is a view showing an example of a positional relation between the TCXO and a heater according to the embodiment.

Here, the outer appearance of the oscillating device 1 of the embodiment will be described. The outer appearance specifically means a positional relation among the TCXO 2, the heater 6 and the temperature sensor 7. FIG. 6 is a schematic bottom view showing a surface provided with the terminals 9 of the TCXO 2 according to the embodiment. As shown in FIG. 6, the heater 6 contacts a package surface (portion other than the terminals 9) of the TCXO 2. Accordingly, heat can be efficiently conducted to the TCXO 2.

Figure 7A:
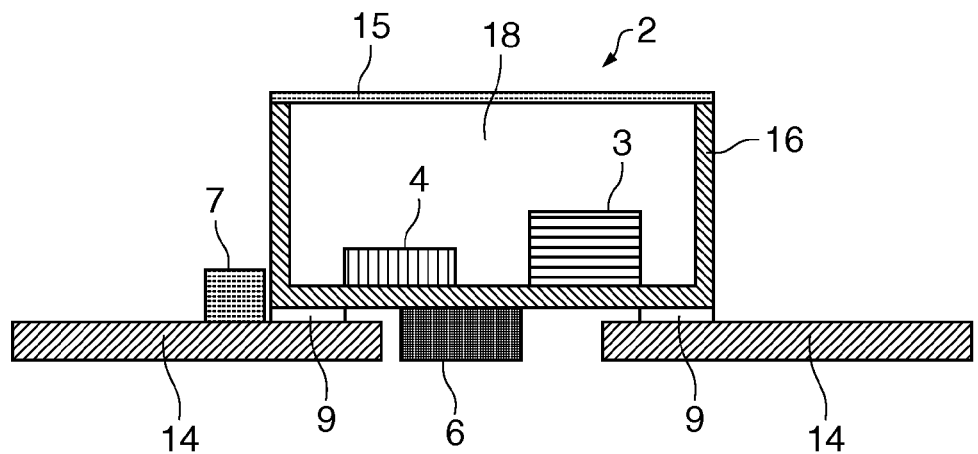
FIG. 7A is a schematic sectional view showing an example of the positional relation between the TCXO and the heater according to the embodiment.

FIG. 7A is a schematic sectional view showing a positional relation among the TCXO 2 of the embodiment, the heater 6 (that is, the power transistor 30 of FIG. 5), the temperature sensor 7 (that is, the NTC thermistor 11 of FIG. 5) and a printed board 14 (for example, a glass epoxy board) (the same applies to FIG. 7B to FIG. 8B). Incidentally, wiring between the heater 6 and the temperature sensor 7, and other circuits are not shown.

As shown in FIG. 7A, in the oscillating device 1 of the embodiment, a hole is formed in a portion of the printed board 14 between the terminals 9, and the heater 6 is attached to a package 16 of the TCXO 2 by, for example, an adhesive.

The quartz crystal resonator 3 and the integrated circuit 4 are attached to the inside of the package 16, and the TCXO 2 is sealed with a cover 15. Thus, the inner closed space functions as a pseudo oven 18, and can keep the temperature constant. In the oscillating device 1 of the embodiment, the heater 6 heats the TCXO 2, and the temperature of the oven 18 falls in a specified temperature range included in the temperature compensation range. At this time, as described using FIG. 4, the frequency stability comparable to the OCXO can be obtained.

Here, in order to suitably control the heater 6, the temperature sensor 7 is required to measure the environmental temperature of the quartz crystal resonator 3, that is, the temperature of the oven 18 (corresponding to the temperature of the object to be heated in FIG. 5). In this embodiment, the temperature sensor 7 is arranged on the printed board 14 near the TCXO 2. The heater 6 is controlled based on the measured value of the temperature sensor 7.

Although the temperature sensor 7 measures the temperature of the oven 18, since the temperature sensor is arranged not inside but outside the TCXO 2, an error occurs between the measured value and the actual temperature of the oven 18. Then, the temperature range of the oven 18, which is set by the heater 6, is preferably narrowed from the temperature compensation range of the TCXO 2 by the amount of the error. That is, a margin larger than the error is preferably provided.

Figure 9:
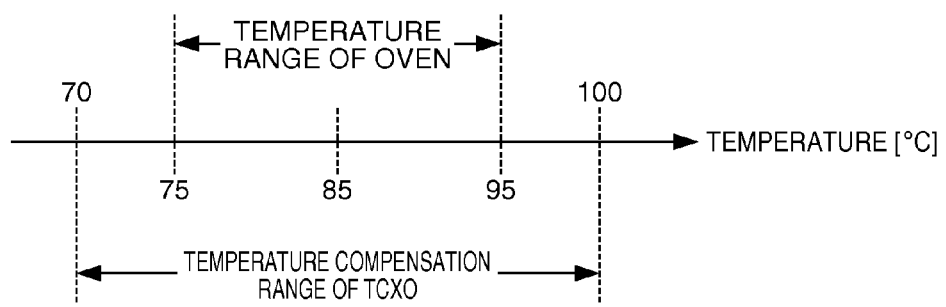
FIG. 9 is a view showing a relation between a temperature range of an oven and a temperature compensation range according to the embodiment.

FIG. 9 is a view showing a relation between the temperature range (temperature range to be set) of the oven 18 and the temperature compensation range of the TCXO 2. In the example of FIG. 9, in view of the error of the temperature sensor 7, a margin of 5° C. is provided with respect to the temperature compensation range of the TCXO 2, and the temperature range of the oven 18 is determined. Thus, for example, even if there is an error of −5° C., since the temperature of the oven is in the temperature compensation range of the TCXO 2, the desired frequency stability can be obtained.

Figure 7B:
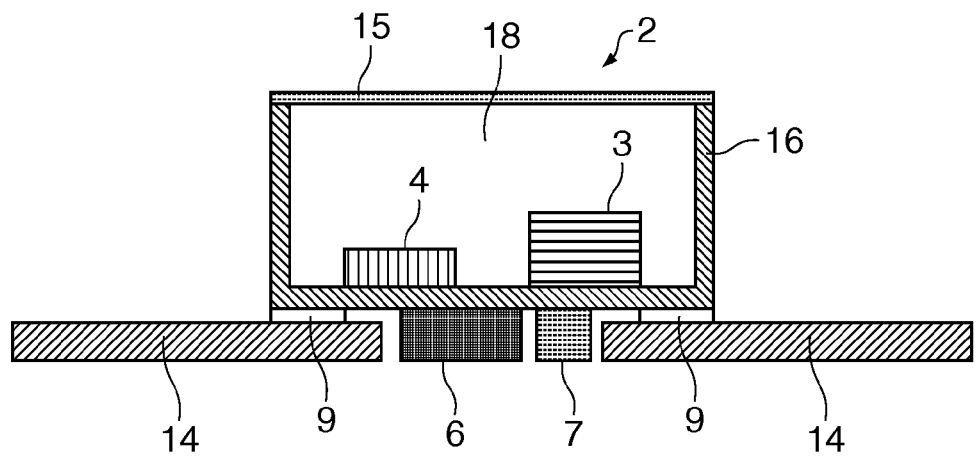
FIG. 7B is a schematic sectional view showing an example of the positional relation between the TCXO and the heater according to a modified example.
Figure 8A:
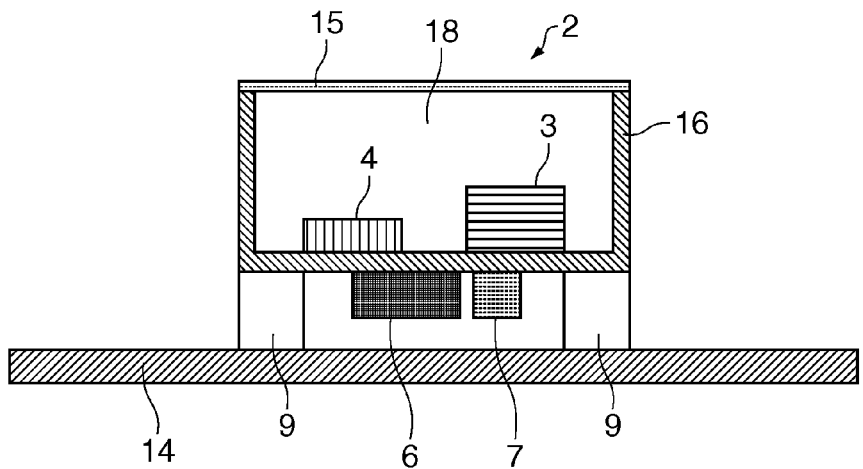
FIGS. 8A and 8B are schematic sectional views showing examples of positional relations between TCXOs and heaters according to other modified examples in which a printed board is not processed.
Figure 8B:
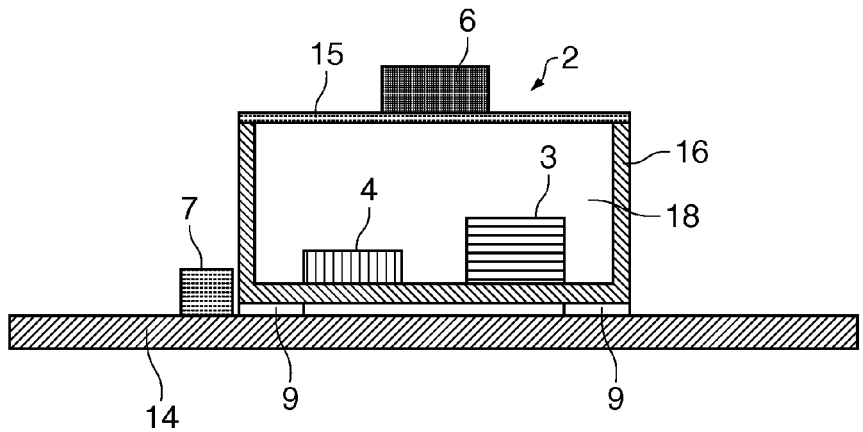

Here, FIG. 7B, FIG. 8A and FIG. 8B show modified examples of the positional relation among the TCXO 2, the heater 6 and the temperature sensor 7. In the example of FIG. 7B, as compared with FIG. 7A, the position of the temperature sensor 7 is different. In the example of FIG. 7B, not only the heater 6 but also the temperature sensor 7 is attached to the package 16 of the TCXO 2 by, for example, an adhesive. Thus, there is a possibility that the temperature of the oven 18 can be more accurately measured.

FIG. 8A and FIG. 8B show arrangement examples when the printed board 14 is not processed. In the example of FIG. 8A, the terminal 9 has sufficient height differently from the example of FIG. 7B. Thus, even if a hole is not formed in the bottom of the package 16, the heater 6 and the temperature sensor 7 can be attached to the bottom of the package 16.

In the example of FIG. 8B, the heater 6 which can not be attached to the bottom of the package 16 is attached to the cover 15. Also in this case, the heater 6 can effectively conduct heat to the TCXO 2. Incidentally, the temperature sensor 7 is arranged on the printed board 14 near the TCXO 2 similarly to the embodiment.

In any outer appearance shown in FIG. 7A to FIG. 8B, the temperature of the oven 18 is made to fall in the specified range (in the temperature range narrowed from the temperature compensation range in view of the error of the temperature sensor 7) by the heater 6, so that the frequency stability comparable to the OCXO can be obtained.

5. Manufacturing Method of the Oscillating Device

Figure 10:
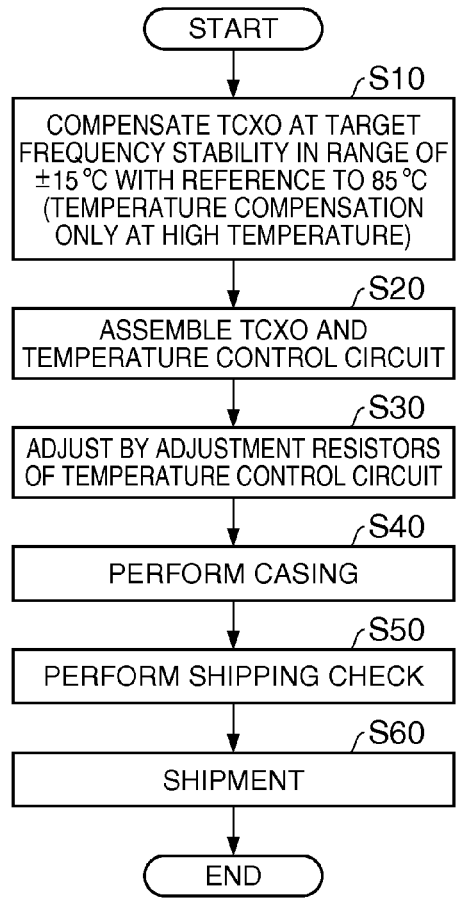
FIG. 10 is a flowchart showing a manufacture method of the oscillating device of the embodiment.

FIG. 10 is a flowchart showing a manufacturing method of the oscillating device 1 of the embodiment. First, temperature compensation is performed in a range of ±15° C. with respect to 85° C. as the upper limit temperature of the use temperature range (S10). At this time, linear approximation may be performed so that frequency stability (for example, in ±100 ppb) as a target is obtained at, for example, 85° C.

Next, the TCXO and the temperature control circuit are assembled (S20). Then, adjustment is performed by adjustment resistors (corresponding to the resistors 40 to 42 of FIG. 5) so that the set temperature of the oven falls in the specified temperature range (S30).

Thereafter, casing is performed (S40), shipping check is performed (S50), and a good product is shipped (S60). Here, in the manufacturing method of the oscillating device 1 of the embodiment, the step 30 is much different from the related art.

For example, in the OCXO, the set temperature of the oven is required to fall in ±1° C. of a target temperature (for example, 85° C.). Thus, time is required for adjustment, and the efficiency of manufacture is reduced.

However, in the manufacturing method of the oscillating device 1 of the embodiment, when the example of FIG. 9 is used, even if the error of the temperature sensor 7 is considered, the temperature of the oven has only to fall within the range of 85° C.±10° C. Thus, the adjustment is hardly required, and the efficiency of manufacture is increased.

As described above, in the oscillating device 1 of the embodiment, while the frequency stability of the TCXO is increased by performing the highly accurate compensation using the linear approximation, the adjustment of the set temperature of the oven is hardly required. Thus, the efficiency of manufacture is not reduced. Besides, a constant temperature oven is not required unlike the OCXO. Accordingly, the small and inexpensive oscillating device can be provided.

6. Electronic Apparatus

Figure 11:
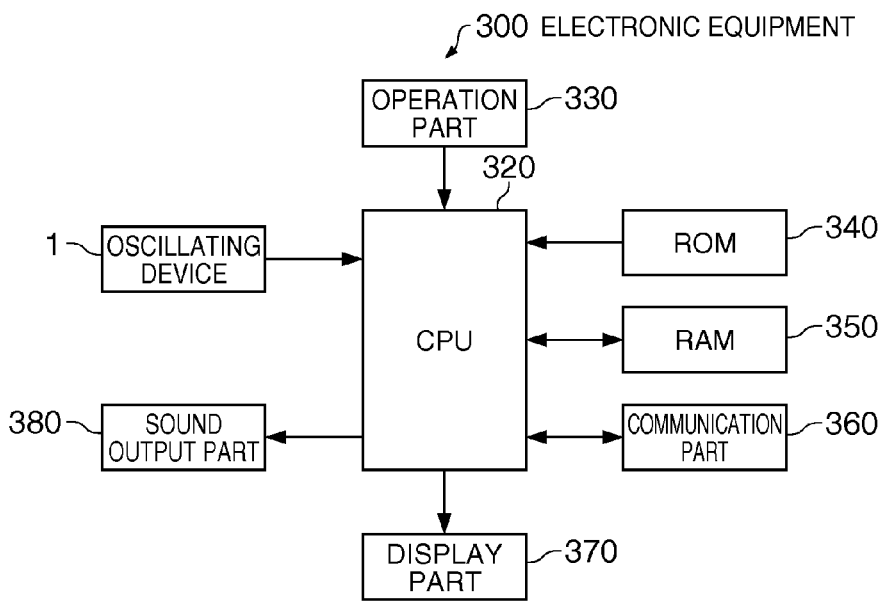
FIG. 11 is a functional block diagram of an electronic apparatus according to an applied example.

FIG. 11 is a functional block diagram of an electronic apparatus 300 according to an applied example. The electronic apparatus 300 according to the applied example includes an oscillating device 1, a CPU (Central Processing Unit) 320, an operation part 330, a ROM (Read Only Memory) 340, a RAM (Random Access Memory) 350, a communication part 360, a display part 370 and a sound output part 380. Incidentally, in the electronic apparatus 300 according to the applied example, a part of the components (respective parts) of FIG. 11 may be omitted or modified, or another component may be added.

As described in the above embodiment, the oscillating device 1 can output a highly accurate oscillation signal (clock signal).

The CPU 320 performs various calculation processes and control processes in accordance with a program stored in the ROM 340 or the like and by using the oscillation signal (clock signal) outputted by the oscillating device 1. Specifically, the CPU 320 performs various processes corresponding to operation signals from the operation part 330, a process to control the communication part 360 for performing data communication with the outside, a process to transmit a display signal for causing the display part 370 to display various information, a process to cause the sound output part 380 to output various sounds, and the like.

The operation part 330 is an input device including an operation key, a button switch and the like, and outputs an operation signal corresponding to a user's operation to the CPU 320.

The ROM 340 stores programs and data by which the CPU 320 performs various calculation processes and control processes.

The RAM 350 is used as a work area of the CPU 320, and temporarily stores a program and data read from the ROM 340, data inputted from the operation part 330, results of calculation executed by the CPU 320 in accordance with various programs, and the like.

The communication part 360 performs various controls to establish data communication between the CPU 320 and an external device.

The display part 370 is a display device constructed of an LCD (Liquid Crystal Display) or the like, and displays various information based on the display signal inputted from the CPU 320.

The sound output part 380 is a device, such as speaker, to output a sound.

According to the electronic apparatus 300 of the embodiment, the highly accurate clock signal comparable to that of the OCXO can be obtained by the oscillating device 1. Thus, it is conceivable to apply the invention to the electronic apparatus 300 such as a small base station for a small communication area such as a femto cell, a base station of a cellular phone covering a wide area, or a measurement device having high resolution.

7. Others

The invention is not limited to the above embodiment, but can be variously modified within the scope of the spirit of the invention.

Although the above embodiment is described while the temperature compensated crystal oscillator (TCXO) is used as the oscillator included in the oscillating device, the oscillator of the invention is not limited to this. For example, a piezoelectric oscillator, a SAW oscillator, a voltage controlled oscillator, a silicon oscillator, an atomic oscillator or the like may be used.

Besides, in this embodiment, although the quartz crystal resonator is used as the oscillating element of the oscillator, the oscillating element may be, for example, a SAW (Surface Acoustic Wave) resonator, an AT-cut quartz crystal resonator, an SC-cut quartz crystal resonator, a tuning fork quartz crystal resonator, another piezoelectric resonator, a MEMS (Micro Electro Mechanical Systems) oscillator or the like. As a board material of the oscillating element, a piezoelectric single crystal such as quartz crystal, lithium tantalate or lithium niobate, piezoelectric material such as piezoelectric ceramics of lead zirconate titanate or the like, silicon semiconductor material or the like can be used. Besides, a unit configured to excite the oscillating element may use a piezoelectric effect, or electrostatic driving using coulomb force.

The above embodiment and the modified examples are merely exemplary, and no limitation is made to these. For example, the respective embodiments and the respective modified examples may be appropriately combined.

The invention includes substantially the same structure (for example, the same structure in function, method and result, or the same structure in object and effect) as the structure described in the embodiment. Besides, the invention includes the structure in which a portion not essential in the structure described in the embodiment is replaced. Besides, the invention includes the structure having the same operation and effect as the structure described in the embodiment or the structure in which the same object can be achieved. Besides, the invention includes the structure in which a well-known technique is added to the structure described in the embodiment.

The entire disclosure of Japanese Patent Application No. 2012-117165, filed May 23, 2012 is expressly incorporated by reference herein.

What is claimed is:

1. An oscillating device comprising:
   a temperature compensated oscillator that includes an oscillating element, the oscillating element having a frequency temperature characteristic obtained based on a first temperature range by linear function approximation, the first temperature range having a first upper-limit temperature and a first lower-limit temperature; and
   a temperature control circuit that controls the temperature of the oscillating element within a second temperature range, the second temperature range having a second upper-limit temperature and a second lower-limit temperature, wherein
   the temperature compensated oscillator is used within an operating temperature having an operating upper-limit temperature and an operating lower-limit temperature, the operating upper-limit temperature is within the first temperature range, and the temperature compensated oscillator compensates the frequency temperature characteristic of the oscillating element placed within the first temperature range by the linear function approximation, and
   the second temperature range is within the first temperature range and includes the operating upper-limit temperature.

2. The oscillating device according to claim 1, wherein
   the temperature control circuit includes a temperature sensor to measure the temperature of the oscillating element,
   a lower-limit temperature difference between the first lower-limit temperature and the second lower-limit temperature is larger than a measurement temperature difference between the measured temperature of the oscillating element by the temperature sensor and an actual temperature of the oscillating element, and
   an upper-limit temperature difference between the first upper-limit temperature and the second upper-limit temperature is larger than the measurement temperature difference.

3. The oscillating device according to claim 1, wherein the temperature control circuit includes a heat generating element to heat the oscillating element.

4. The oscillating device according to claim 1, wherein the oscillating element is a resonator.

5. An electronic apparatus comprising an oscillating device according to claim 1.

6. An electronic apparatus comprising an oscillating device according to claim 2.

7. An electronic apparatus comprising an oscillating device according to claim 3.

8. An electronic apparatus comprising an oscillating device according to claim 4.

* * * * *